(12) United States Patent
Tran et al.

(10) Patent No.: US 7,204,888 B2
(45) Date of Patent: Apr. 17, 2007

(54) LIFT PIN ASSEMBLY FOR SUBSTRATE PROCESSING

(75) Inventors: Toan Q. Tran, San Jose, CA (US); Daniel S. Herkalo, San Jose, CA (US); Yen-Kun V. Wang, Fremont, CA (US); Jin Ho Lee, Suwon Kyunggi (KR); Dong Hyung Lee, Suwon Kyunggi (KR); Jang Seok Oh, Suwon Kyunggi (KR); Won B. Bang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 475 days.

(21) Appl. No.: 10/428,967

(22) Filed: May 1, 2003

(65) Prior Publication Data

US 2004/0219006 A1 Nov. 4, 2004

(51) Int. Cl.
*C23C 16/00* (2006.01)
*C23F 1/00* (2006.01)
*H01L 21/306* (2006.01)

(52) U.S. Cl. ............ 118/728; 156/345.51; 156/345.52; 156/345.53; 156/345.54; 156/345.55; 118/729; 118/730

(58) Field of Classification Search ........... 156/345.51, 156/345.52, 345.53; 118/728, 725
See application file for complete search history.

(56) References Cited

U.S. PATENT DOCUMENTS 5,848,670 A 12/1998 Salzman

| | | | |
|---|---|---|---|
| 6,227,786 B1 * | 5/2001 | Tateyama | 118/724 |
| 6,435,798 B1 * | 8/2002 | Satoh | 414/217 |
| 6,578,423 B2 * | 6/2003 | Fischer | 73/630 |
| 6,609,909 B2 * | 8/2003 | Aoki et al. | 432/258 |

\* cited by examiner

*Primary Examiner*—Parviz Hassanzadeh
*Assistant Examiner*—Rakesh Dhingra
(74) *Attorney, Agent, or Firm*—Townsend and Townsend and Crew LLP

(57) ABSTRACT

Embodiments of the present invention provide an apparatus for constraining and supporting the lift pins to prevent or minimize lateral movement of the lift pins that causes substrate hand-off problems and associated degradation in substrate processing characteristics and results. In one embodiment, a lift pin assembly for manipulating a substrate above a support surface of a substrate support comprises a plurality of lift pins movable between an up position and a down position. The lift pins include top ends and bottom ends. The top ends are configured to be lifted above the support surface of the substrate support to contact a bottom surface of the substrate in the up position. The top ends are configured to be positioned at or below the support surface of the substrate support in the down position. A lift pin connecting member is attached to the plurality of lift pins at attachment locations at or near the bottom ends of the lift pins to maintain fixed relative distances between the lift pins at the attachment locations and to move with the lift pins between the up position and the down position.

21 Claims, 2 Drawing Sheets

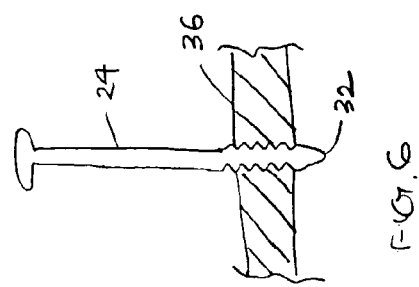
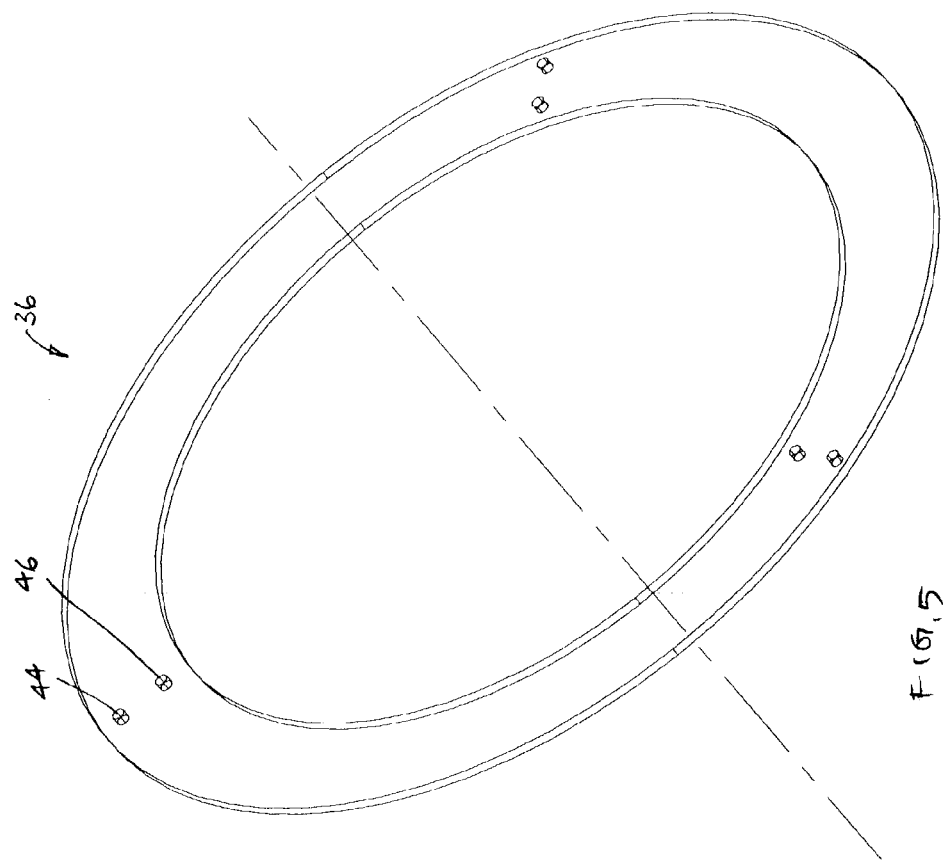

LIFT PIN ASSEMBLY FOR SUBSTRATE PROCESSING

CROSS-REFERENCES TO RELATED APPLICATIONS

Not Applicable

BACKGROUND OF THE INVENTION

The invention relates to apparatus for manipulating substrates and, more particularly, to an apparatus for lifting a substrate from the surface of a pedestal in a semiconductor substrate processing system.

A conventional semiconductor wafer processing system contains a reaction chamber within which a wafer is supported by a pedestal subsystem having a pedestal that cooperates with a lift pin assembly. A wafer transport robot operating in cooperation with a lift pin assembly positions the wafer above the pedestal. The robot moves the wafer into the chamber through a slit valve. The lift pins of the lift pin assembly extend above the surface of the pedestal and lift the wafer from the robot arm. The lift pins are usually elevated, by a lift mechanism, to provide clearance for the robot blade of the robot arm. The lift mechanism typically includes a lift plate in contact with the bottom ends of the lift pins and being driven by an actuator to move the lift pins up and down. The lift mechanism, usually under control of a computer control system, then lowers the lift pins below the pedestal so that the wafer is placed onto the surface of the pedestal. The pedestal may either mechanically or electrostatically clamp, i.e., chuck, the wafer to the pedestal.

After the wafer is placed onto the support surface of the pedestal, the lift pins continue to descend into the pedestal to a fully retracted position. Then, the wafer is usually chucked and one or more semiconductor fabrication process steps are performed in the chamber, such as deposition or etching films on the wafer. After completion of the process steps, the lift mechanism extends the lift pins to raise the wafer above the pedestal so that the wafer can be removed from the chamber via the robotic transport. When using an electrostatic chuck, before the lift pins can raise the wafer, the wafer must be electrically dechucked, i.e., the electrostatic force retaining the wafer on the pedestal must be removed or canceled. However, even after applying a conventional dechucking method, a residual charge still remains on the wafer and pedestal due to charge migration and/or field emission charging. As such and without damaging the wafer, the lift pins must forcibly lift the wafer to separate the wafer from the pedestal.

Additionally, different wafer sizes, e.g., 200 mm or 300 mm, are being used in semiconductor processing. Longer lift pins may be needed for processing some wafers to adequately provide clearance for robotic transport. Increasing the length of the lift pins increases the tendency for the lift pins to bow or slide relative to the lift plate, especially with the additional lifting and clamping forces involved with larger wafers. FIG. 1 shows sliding of the lift pins 10 on the lift plate 12 as the lift plate 12 moves the lift pins 10 and the substrate 14 up and down with respect to the substrate holder or pedestal 16. When sliding of the lift pins 10 occurs, the substrate 14 may not be properly aligned with the substrate support 16 when the lift pins 10 are lowered to place the substrate 14 on the support 16. For instance, the support surface 18 of the substrate support 16 may have a pocket to receive the substrate 14. If the substrate 14 is out of alignment with respect to the support surface 18, the substrate 14 may be tilted. This may affect the spacing between the substrate and the process gas flow (e.g., from a faceplate disposed above the substrate) or the heating of the substrate 14 by a heater provided in the substrate support 16.

BRIEF SUMMARY OF THE INVENTION

Embodiments of the present invention provide an apparatus for constraining and supporting the lift pins to prevent or minimize lateral movement of the lift pins that causes substrate hand-off problems and associated degradation in substrate processing characteristics and results. This is accomplished by fixedly attaching the lift pins to a lift pin connecting member at attachment locations at or near the bottom ends of the lift pins. The lift pin connecting member maintains fixed relative distances between the lift pins at the attachment locations. In this way, the lift pins are more stable near the bottom ends, and are constrained to move up and down together with little or no lateral movement.

In accordance with one embodiment of the present invention, a lift pin assembly for manipulating a substrate above a support surface of a substrate support comprises a plurality of lift pins movable between an up position and a down position. The lift pins include top ends and bottom ends. The top ends are configured to be lifted above the support surface of the substrate support to contact a bottom surface of the substrate in the up position. The top ends are configured to be positioned at or below the support surface of the substrate support in the down position. A lift pin connecting member is attached to the plurality of lift pins at attachment locations at or near the bottom ends of the lift pins to maintain fixed relative distances between the lift pins at the attachment locations and to move with the lift pins between the up position and the down position.

In another embodiment, a lift pin assembly for manipulating a substrate above a support surface of a substrate support comprises a plurality of lift pins configured to extend through lift pin bores of the substrate support and to be movable between an up position and a down position. The lift pins include top ends and bottom ends. The top ends are configured to be lifted above the support surface of the substrate support to contact a bottom surface of the substrate in the up position. The top ends are configured to be positioned at or below the support surface of the substrate support in the down position. A lift pin connecting member is fixed to the plurality of lift pins at attachment locations at or near the bottom ends of the lift pins to maintain fixed relative distances between the lift pins at the attachment locations.

In another embodiment, a lift pin assembly for manipulating a substrate above a support surface of a substrate support comprises a plurality of lift pins movable between an up position and a down position. The lift pins include top ends and bottom ends. The top ends are configured to be lifted above the support surface of the substrate support to contact a bottom surface of the substrate in the up position. The top ends are configured to be positioned at or below the support surface of the substrate support in the down position. A lift pin connecting member is threadingly attached to the plurality of lift pins at fixed attachment locations at or near the bottom ends of the lift pins.

BRIEF DESCRIPTION OF THE DRAWINGS

FIG. 5 is a perspective view of a lift pin connecting ring according to an embodiment of the present invention; and FIG. 6 is a cross-sectional view showing a threaded connection between a lift pin and a lift pin connecting ring according to an embodiment of the present invention.

DETAILED DESCRIPTION OF THE INVENTION

Figure 2:
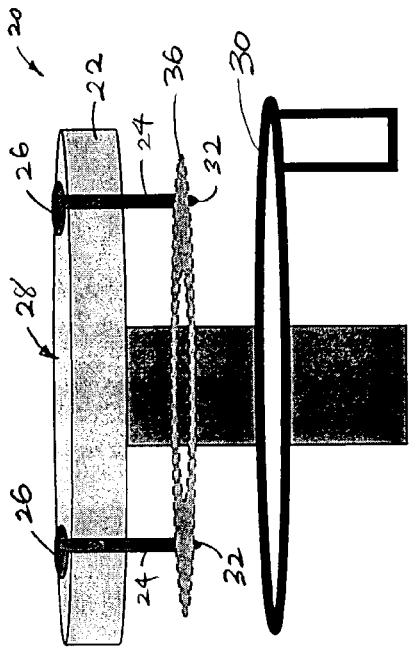
FIG. 2 is a simplified view of a substrate processing apparatus illustrating a release position of the lift pins according to an embodiment of the present invention.

FIG. 2 shows a lift pin assembly 20 and a substrate support or pedestal 22 for manipulating a substrate. The lift pin assembly 20 includes a plurality of lift pins 24 which are movable up and down between an up or lift position and a down or release position. The lift pin assembly typically includes at least three lift pins 24. The lift pins 24 extend through lift pin bores provided in the substrate support. FIG. 2 shows the lift pins 24 in the release position. The top ends 26 of the lift pins 24 are at or below the support surface 28 of the substrate support 22. FIG. 2 shows the lift plate or strike plate 30 spaced from the bottom ends 32 of the lift pins 24 in the release or down position. In other embodiments, the lift plate 30 may contact the bottom ends 32 of the lift pins 24 in the release position as long as it does not push the lift pins 24 above the support surface 28 of the substrate support 22.

A lift pin connecting member 36 is attached to the lift pins 24 at attachment locations at or near the bottom ends 32 of the lift pins 24. The bottom ends 32 of the lift pins 24 typically protrude slightly through the connecting member 36 so that they may make contact with the lift plate 30. FIG. 2 shows a lift pin connecting ring 36 which is disposed below the substrate support 22. The lift pin connecting member 36 maintains fixed relative distances between the lift pins 24 at the attachment locations. The lift pin connecting member 36 moves with the lift pins 24 between the up position and the down position.

Figure 3:
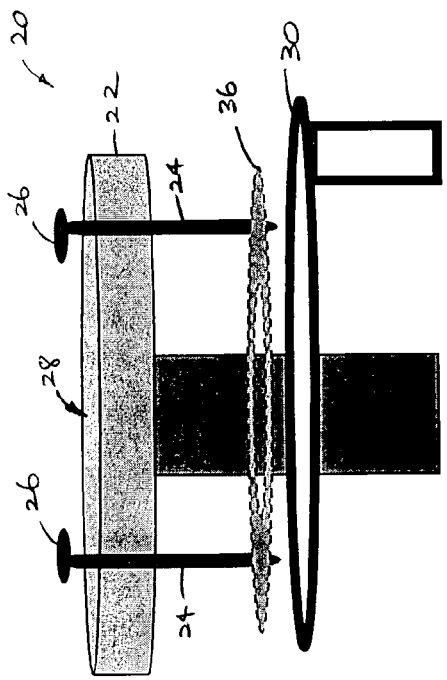
FIG. 3 is a simplified view of the substrate processing apparatus of FIG. 2 illustrating a lift position of the lift pins.
Figure 1:
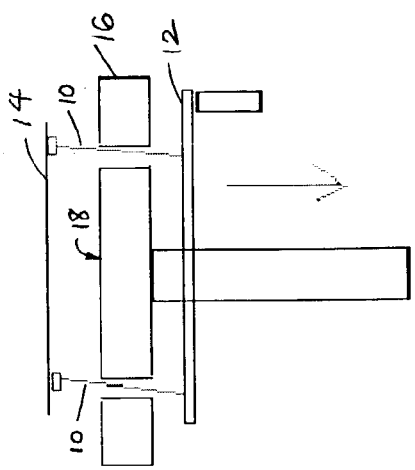
FIG. 1 is a simplified elevational view of a substrate processing apparatus illustrating sliding of lift pins on a lift plate.

FIG. 3 shows the lift pins 24 being moved by the lift plate 30 to the up or lift position. The top ends 26 of the lift pins 24 are lifted above the support surface 28 of the substrate support 22 to contact the bottom surface of a substrate. The lift pin connecting member 36 moves with the lift pins 24 to the lift position.

Figure 4:
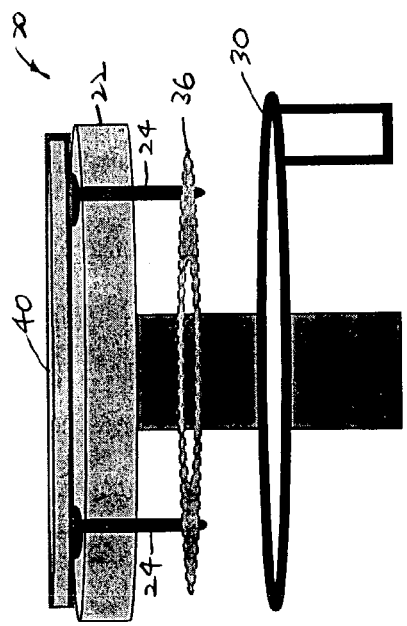
FIG. 4 is a simplified view of the substrate processing apparatus of FIG. 2 illustrating a process position of the lift pins.

After the substrate 40 is placed onto the top ends 26 of the lift pins 24, the lift plate 30 is actuated to lower the lift pins 24 so that the substrate 40 rests on the support surface 28 of the substrate support 22 for processing in the process position as seen in FIG. 4. The lift pin connecting member 36 moves with the lift pins 24 to the down position or process position.

FIG. 5 shows an embodiment of the lift pin connecting member 36 in the form of a connecting ring having a plurality of apertures for attaching to the lift pins 24. The connecting ring 36 includes three outer apertures 44 and three inner apertures 46. The outer apertures 44 accommodate an apparatus having lift pins that are spaced further apart than those that fit into the inner apertures 46 (e.g., due to a difference in the size of the substrate). In the embodiment shown, the connecting ring 36 has an outer diameter equal to or smaller than the outer diameter of the lift plate 30. In one example, the connecting ring 36 has an outer diameter of about 10.5 inches, an inner diameter of about 8.25 inches, and a thickness of about 0.18 inch for use with a 300 mm substrate. The number and arrangement of the apertures may vary in different embodiments of the connecting ring 36. The connecting ring 36 may be made of any suitable material, including metal and ceramic such as alumina or a composite including about 99.5% alumina.

Various attachment mechanisms can be used to attach the lift pins 24 to the connecting ring 36. In one embodiment as shown in FIG. 6, the lift pins 24 are threadingly attached to the connecting ring 36. The apertures 44 or 46 are threaded. The lift pins 24 each include a threaded portion at the attachment location at or near the bottom end 32 thereof. By fixedly attaching the lift pins 24 to the connecting ring 36 at the attachment locations, the apparatus prevents or minimizes lateral movement of the lift pins 24 that causes substrate hand-off problems and associated degradation in substrate processing characteristics and results.

The above-described arrangements of apparatus and methods are merely illustrative of applications of the principles of this invention and many other embodiments and modifications may be made without departing from the spirit and scope of the invention as defined in the claims. The lift pin connecting member may have other shapes. Other ways of attaching the lift pins and the lift pin connecting member may be employed. The scope of the invention should, therefore, be determined not with reference to the above description, but instead should be determined with reference to the appended claims along with their full scope of equivalents.

What is claimed is:

1. A lift pin assembly for manipulating a substrate above a support surface of a substrate support, the lift pin assembly comprising:

a plurality of lift pins movable between an up position and a down position, the lift pins including top ends and bottom ends, the top ends being configured to be lifted above the support surface of the substrate support to contact a bottom surface of the substrate in the up position, the top ends being configured to be positioned at or below the support surface of the substrate support in the down position;

a lift pin connecting member attached to the plurality of lift pins at attachment locations at or near the bottom ends of the lift pins to maintain fixed relative distances between the lift pins at the attachment locations and to move with the lift pins between the up position and the down position; and a lift plate being driven to move between the down position and the up position, the lift plate contacting the lift pins to move the lift pins between the down position and the up position, the lift plate being spaced from the lift pin connecting member.

2. The lift pin assembly of claim 1 wherein the lift pin connecting member comprises a lift pin connecting ring.

3. The lift pin assembly of claim 1 wherein the lift pin connecting member is threadingly attached to the lift pins at the attachment locations at or near the bottom ends of the lift pins.

4. The lift pin assembly of claim 3 wherein the lift pin connecting member includes a plurality of threaded apertures and the lift pins include threaded portions at the attachment locations to be threadingly attached to the threaded apertures.

5. The lift pin assembly of claim 1 wherein the lift pins are configured to extend through lift pin bores in the substrate support.

6. The lift pin assembly of claim 1 wherein the lift pin connecting member is configured to be disposed generally below the substrate support.

7. The lift pin assembly of claim 1 comprising at least three lift pins.

8. The lift pin assembly of claim 1 further comprising a lift plate in contact with the bottom ends of the lift pins and being driven to move the lift pins between the up position and the down position.

9. The lift pin assembly of claim 1 wherein the lift plate is separated from the lift pins in the down position.

10. The lift pin assembly of claim 1 wherein the lift plate slideably contacts the lift pins at the bottom ends of the lift pins to move the lift pins between the down position and the up position.

11. A lift pin assembly for manipulating a substrate above a support surface of a substrate support, the lift pin assembly comprising:
   a plurality of lift pins configured to extend through lift pin bores of the substrate support and to be movable between an up position and a down position, the lift pins including top ends and bottom ends, the top ends being configured to be lifted above the support surface of the substrate support to contact a bottom surface of the substrate in the up position, the top ends being configured to be positioned at or below the support surface of the substrate support in the down position;
   a lift pin connecting member fixed to the plurality of lift pins at attachment locations at or near the bottom ends of the lift pins to maintain fixed relative distances between the lift pins at the attachment locations and to move with the lift pins between the up position and the down position; and
   a lift plate being driven to move between the down position and the up position, the lift plate contacting the lift pins to move the lift pins between the down position and the up position, the lift plate being spaced from the lift pin connecting member.

12. The lift pin assembly of claim 11 wherein the lift pin connecting member comprises a lift pin connecting ring.

13. The lift pin assembly of claim 11 wherein the lift pin connecting member is threadingly attached to the lift pins at the attachment locations at or near the bottom ends of the lift pins.

14. The lift pin assembly of claim 13 wherein the lift pin connecting member includes a plurality of threaded apertures and the lift pins include threaded portions at the attachment locations to be threadingly attached to the threaded apertures.

15. The lift pin assembly of claim 11 wherein the lift pin connecting member is configured to be disposed generally below the substrate support.

16. A lift pin assembly for manipulating a substrate above a support surface of a substrate support, the lift pin assembly comprising:
   a plurality of lift pins movable between an up position and a down position, the lift pins including top ends and bottom ends, the top ends being configured to be lifted above the support surface of the substrate support to contact a bottom surface of the substrate in the up position, the top ends being configured to be positioned at or below the support surface of the substrate support in the down position;
   a lift pin connecting member threadingly attached to the plurality of lift pins at fixed attachment locations at or near the bottom ends of the lift pins to maintain fixed relative distances between the lift pins at the attachment locations and to move with the lift pins between the up position and the down position; and
   a lift plate being driven to move between the down position and the up position, the lift plate contacting the lift pins to move the lift pins between the down position and the up position, the lift plate being spaced from the lift pin connecting member.

17. The lift pin assembly of claim 16 wherein the lift pin connecting member includes a plurality of threaded apertures and the lift pins include threaded portions at the attachment locations to be threadingly attached to the threaded apertures.

18. The lift pin assembly of claim 16 wherein the lift pin connecting member comprises a lift pin connecting ring.

19. The lift pin assembly of claim 16 wherein the lift pins are configured to extend through lift pin bores in the substrate support.

20. The lift pin assembly of claim 16 wherein the lift pin connecting member is configured to be disposed generally below the substrate support.

21. The lift pin assembly of claim 16 further comprising a lift plate in contact with the bottom ends of the lift pins and being driven to move the lift pins between the up position and the down position.

* * * * *